United States Patent
Maalouf et al.

(10) Patent No.: US 11,194,357 B2
(45) Date of Patent: Dec. 7, 2021

(54) SYSTEMS AND METHODS FOR OPERATING A BIAS CONTROLLER FOR AN AMPLIFIER CIRCUIT

(71) Applicant: NXP USA, Inc., Austin, TX (US)

(72) Inventors: Elie A. Maalouf, Mesa, AZ (US); Xu Jason Ma, Chandler, AZ (US); Ngai-Ming Lau, Fountain Hills, AZ (US)

(73) Assignee: NXP USA, Inc., Austin, TX (US)

( * ) Notice: Subject to any disclaimer, the term of this patent is extended or adjusted under 35 U.S.C. 154(b) by 139 days.

(21) Appl. No.: 16/570,722

(22) Filed: Sep. 13, 2019

(65) Prior Publication Data

US 2021/0080992 A1 Mar. 18, 2021

(51) Int. Cl.
*H03F 1/30* (2006.01)
*G05F 3/24* (2006.01)
*H03F 1/52* (2006.01)
*H03F 3/04* (2006.01)

(52) U.S. Cl.
CPC ............ *G05F 3/245* (2013.01); *H03F 1/30* (2013.01); *H03F 1/52* (2013.01); *H03F 3/04* (2013.01); *H03F 1/301* (2013.01); *H03F 1/302* (2013.01); *H03F 2203/45284* (2013.01)

(58) Field of Classification Search
CPC .. G05F 3/245; H03F 1/30; H03F 2203/45284; H03F 3/04; H03F 1/301; H03F 1/302; H03F 1/52
USPC ................ 330/256, 266, 272, 289, 296, 298
See application file for complete search history.

(56) References Cited

U.S. PATENT DOCUMENTS

| | | |
|---|---|---|
| 4,302,727 A | 11/1981 | Iwamatsu |
| 5,444,419 A | 8/1995 | Honda |
| 7,888,987 B2 | 2/2011 | Horie |

*Primary Examiner* — Khanh V Nguyen
*Assistant Examiner* — Khiem D Nguyen

(57) ABSTRACT

Embodiments of a method and a device are disclosed. In an embodiment, a method for operating a bias controller for an amplifier circuit involves obtaining temperature data corresponding to a temperature of the amplifier circuit, generating a proportional to absolute temperature (PTAT) bias voltage based on a first PTAT slope when the temperature is within a first range of temperatures or a second PTAT slope when the temperature is within a second range of temperatures, wherein the second PTAT slope is greater than the first PTAT slope, and biasing the amplifier circuit based on the generated PTAT bias voltage.

18 Claims, 4 Drawing Sheets

SYSTEMS AND METHODS FOR OPERATING A BIAS CONTROLLER FOR AN AMPLIFIER CIRCUIT

BACKGROUND

A pre-driver circuit of an amplifier (e.g., a radio frequency (RF) power amplifier (PA)) typically has a negative gain characteristic over increasing operating temperatures. Therefore, as the operating temperature of the pre-driver circuit increases, the gain of the pre-driver circuit may be reduced. This may cause a significant reduction in the system level gain performance margin at higher operating temperatures. To compensate for such reduction of the system level gain, the pre-driver circuit may be designed to achieve a gain that lines up with a higher gain margin at high operating temperatures. However, such pre-driver circuit designs may require the addition of stabilization and isolation circuits to maintain the performance integrity of the system, thereby resulting in larger and more costly pre-driver circuits.

SUMMARY

Embodiments of a method and a device are disclosed. In an embodiment, a method for operating a bias controller for an amplifier circuit is disclosed. The method involves obtaining temperature data corresponding to a temperature of the amplifier circuit, generating a proportional to absolute temperature (PTAT) bias voltage based on a first PTAT slope when the temperature is within a first range of temperatures or a second PTAT slope when the temperature is within a second range of temperatures, wherein the second PTAT slope is greater than the first PTAT slope, and biasing the amplifier circuit based on the generated PTAT bias voltage.

In an embodiment, biasing the amplifier circuit includes summing the PTAT bias voltage and a zero to absolute temperature (ZTAT) reference voltage to generate a bias voltage for the amplifier circuit.

In an embodiment, generating the PTAT bias voltage includes generating a PTAT current based on a PTAT reference voltage, applying a PTAT slope to the PTAT current based on the temperature, and converting the PTAT current to the PTAT bias voltage.

In an embodiment, a PTAT slope transition point between the first PTAT slope and the second PTAT slope is set to a predefined temperature.

In an embodiment, the first range of temperatures includes temperature values that are lower than the second range of temperatures.

In an embodiment, the temperature data includes digital temperature data from a temperature sensor circuit.

In an embodiment, the second PTAT slope enables the amplifier circuit to maintain a higher gain at temperatures above 25° C. relative to the first PTAT slope.

In an embodiment, a bias controller for an amplifier circuit is disclosed. The bias controller includes a proportional to absolute temperature (PTAT) bias voltage generator circuit configured to obtain temperature data corresponding to a temperature of the amplifier circuit, and generate a PTAT bias voltage based on a first PTAT slope when the temperature is within a first range of temperatures or a second PTAT slope when the temperature is within a second range of temperatures, wherein the second PTAT slope is greater than the first PTAT slope. The bias controller further includes a biasing circuit configured to bias the amplifier circuit based on the generated PTAT bias voltage.

In an embodiment, the biasing circuit further includes a summing circuit that sums the PTAT bias voltage and a zero to absolute temperature (ZTAT) bias voltage to generate a bias voltage for the amplifier circuit.

In an embodiment, the PTAT bias voltage generator circuit is further configured to generate a PTAT current based on a PTAT reference voltage, apply a PTAT slope to the PTAT current based on the temperature data, and convert the PTAT current to the PTAT bias voltage.

In an embodiment, a PTAT slope transition point between the first PTAT slope and the second PTAT slope is set to a predefined temperature.

In an embodiment, the first range of temperatures includes temperature values that are lower than the second range of temperatures.

In an embodiment, the temperature data includes digital temperature data from a temperature sensor circuit.

In an embodiment, the second PTAT slope enables the amplifier circuit to maintain a higher gain at temperatures above 25° C. relative to the first PTAT slope.

In an embodiment, a proportional to absolute temperature (PTAT) bias voltage generator circuit for biasing an amplifier circuit is disclosed. In an embodiment, the PTAT bias voltage generator circuit includes a controllable current source that includes a PTAT reference current circuit configured to generate a PTAT reference current, a programmable current source configured to obtain temperature data and to generate a PTAT current based on the PTAT reference current and the temperature data, the temperature data corresponding to a temperature of the amplifier circuit, wherein the PTAT current has a first PTAT slope when the temperature is less than or equal to a temperature threshold or has a second PTAT slope when the temperature is greater than the temperature threshold, wherein the second PTAT slope is greater than the first PTAT slope. The PTAT bias voltage generator circuit further includes a current to voltage converter circuit configured to convert the PTAT current to a PTAT bias voltage for the amplifier circuit.

In an embodiment, the controllable current source generates the PTAT reference current based on a PTAT reference voltage.

In an embodiment, a PTAT slope transition point between the first PTAT slope and the second PTAT slope is set to the threshold temperature.

In an embodiment, the programmable current source includes a digital-to-analog converter (DAC) that applies the first PTAT slope or the second PTAT slope to the PTAT reference current based on the temperature data.

In an embodiment, the temperature data includes digital temperature data from a temperature sensor circuit.

In an embodiment, the second PTAT slope enables the amplifier circuit to maintain a higher gain at temperatures above 25° C. relative to the first PTAT slope.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
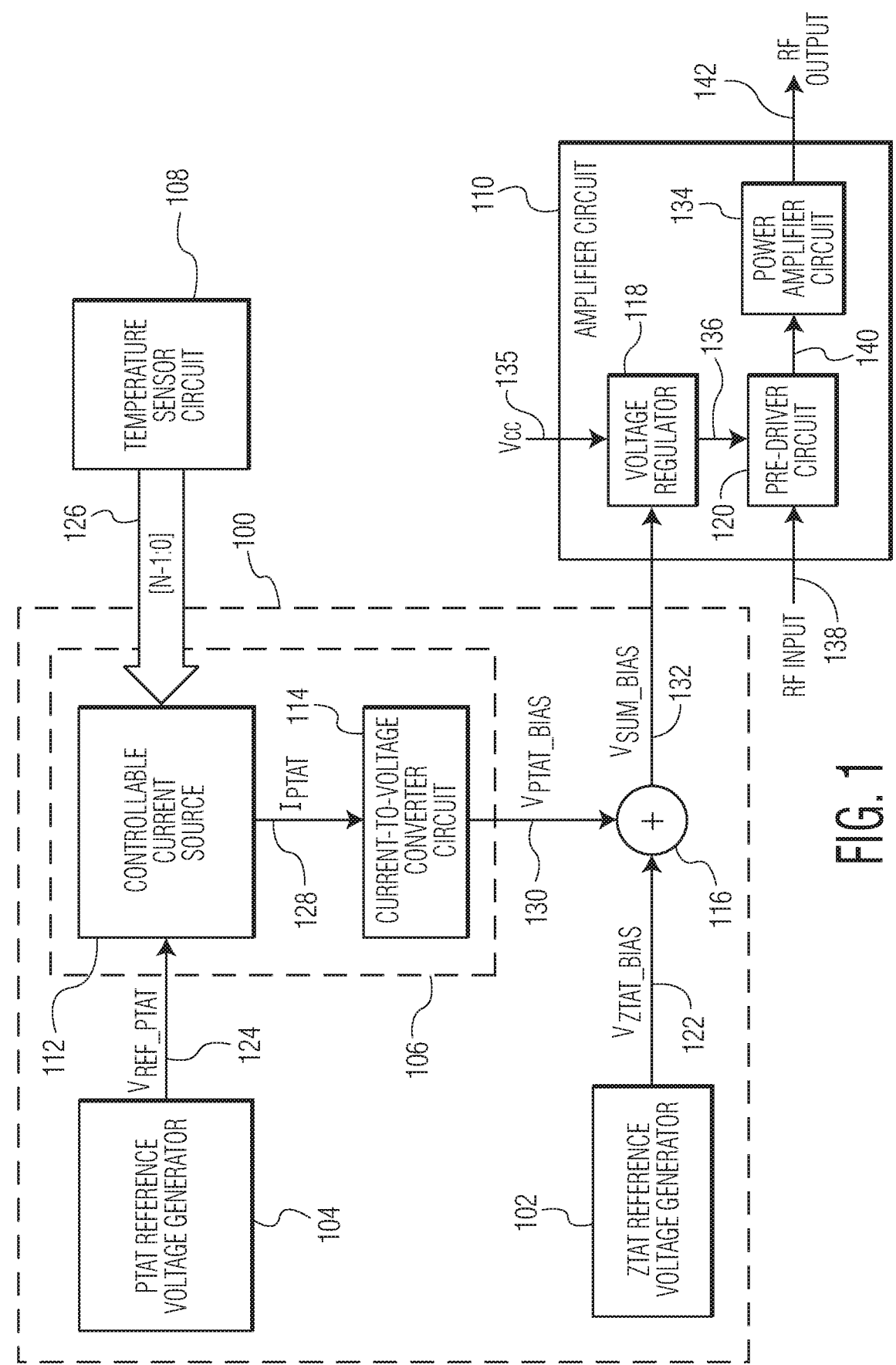
FIG. 1 depicts an exemplary block diagram of a bias controller for an amplifier circuit in accordance with various embodiments of the disclosure.

FIG. 1 depicts an example block diagram of a bias controller 100 for an amplifier circuit 110 in accordance with various embodiments of the disclosure. In an embodiment, the bias controller 100 may be implemented within a single semiconductor die. In other embodiments, the bias controller 100 may be implemented in an integrated circuit (IC) (e.g., a land grid array (LGA) or other suitable IC package) that includes one or more semiconductor dies. As shown in FIG. 1, the bias controller 100 may include a zero to absolute temperature (ZTAT) bias voltage generator circuit 102, a proportional to absolute temperature (PTAT) reference voltage generator circuit 104, a PTAT bias voltage generator circuit 106, and a summing circuit 116 (also referred to as a biasing circuit). In an embodiment, the PTAT bias voltage generator circuit 106 may include a controllable current source 112 and a current-to-voltage converter circuit 114.

As further shown in FIG. 1, the bias controller 100 is coupled to a temperature sensor circuit 108 and to the amplifier circuit 110. In some examples, the amplifier circuit 110 may be implemented as a radio frequency (RF) power amplifier (PA) circuit. The amplifier circuit 110 may include a voltage regulator 118 (e.g., a direct current (DC) linear voltage regulator, such as a low-dropout regulator (LDO)), a pre-driver circuit 120, and a power amplifier circuit 134. The voltage regulator 118 may supply power to the pre-driver circuit 120 by providing a regulated voltage 136 (also referred to as a biasing voltage) to the pre-driver circuit 120. In an embodiment, the voltage regulator 118 may provide the regulated voltage 136 by receiving an input voltage 135 (e.g., indicated as $V_{CC}$ in FIG. 1) and producing an output voltage having a value that is within the design requirements of the pre-driver circuit 120. The value of the output voltage may be controlled (e.g., increased or decreased) by a reference voltage, such as the bias voltage ($V_{SUM\_BIAS}$) 132 described herein. The voltage regulator 118 may steadily maintain the value of the output voltage (e.g., the regulated voltage 136) regardless of changes in the input voltage 135 or load current. The pre-driver circuit 120 may receive the regulated voltage 136 and may apply a relatively low gain to an RF input signal 138 to generate an amplified RF signal 140. The power amplifier circuit 120 may receive the amplified RF signal 140 and may apply a relatively high gain to the amplified RF signal 140 to generate an RF output signal 142.

As shown in FIG. 1, the ZTAT bias voltage generator circuit 102 may generate a ZTAT bias voltage ($V_{ZTAT\_BIAS}$) 122, which may serve as a base voltage for biasing the amplifier circuit 110. In an embodiment, the ZTAT bias voltage generator circuit 102 may be a silicon-germanium (SiGe) bandgap-based voltage reference circuit. For example, the ZTAT bias voltage ($V_{ZTAT\_BIAS}$) 122 may be a temperature independent voltage (also referred to as a near zero-temperature coefficient reference voltage or a bandgap reference voltage).

As further shown in FIG. 1, the PTAT reference voltage generator 104 may generate a PTAT reference voltage ($V_{REF\_PTAT}$) 124 and may provide the PTAT reference voltage ($V_{REF\_PTAT}$) 124 to the controllable current source 112. The PTAT reference voltage ($V_{REF\_PTAT}$) 124 may increase approximately linearly with temperature. In one example, the linear relationship (also referred to as the PTAT slope) between the PTAT reference voltage ($V_{REF\_PTAT}$) 124 and temperature and may be 2.0 mV/° C., meaning that the PTAT reference voltage ($V_{REF\_PTAT}$) 124 increases by 2.0 mV for every 1.0° C. increase in temperature.

Figure 2:
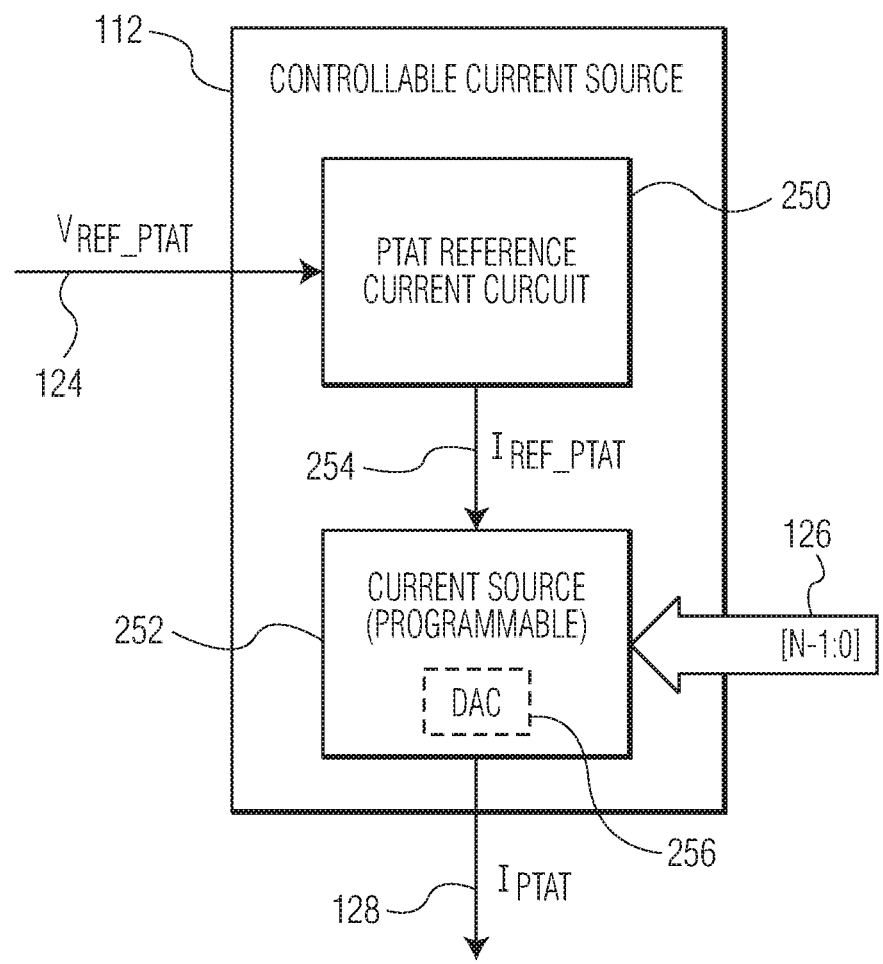
FIG. 2 depicts an example implementation of a controllable current source in accordance with various embodiments of the disclosure.

As explained herein with reference to the example implementation of the controllable current source 112 in FIG. 2, the controllable current source 112 may generate a PTAT current ($I_{PTAT}$) 128 based on the PTAT reference voltage ($V_{REF\_PTAT}$) 124. Since the PTAT reference voltage ($V_{REF\_PTAT}$) 124 increases approximately linearly with temperature, the PTAT current ($I_{PTAT}$) 128 will also increase approximately linearly with temperature. The controllable current source 112 may adjust the linear relationship (e.g., the PTAT slope) that defines the amount of increase in the PTAT current ($I_{PTAT}$) 128 per unit temperature. In one example, the controllable current source 112 may apply a large PTAT slope when converting the PTAT reference voltage ($V_{REF\_PTAT}$) 124 to the PTAT current ($I_{PTAT}$) 128, which may result in a relatively large increase in the PTAT current ($I_{PTAT}$) 128 per unit temperature. In another example, the controllable current source 112 may apply a small PTAT slope when converting the PTAT reference voltage ($V_{REF\_PTAT}$) 124 to the PTAT current ($I_{PTAT}$) 128, which may result in a relatively small increase in the PTAT current ($I_{PTAT}$) 128 per unit temperature. The controllable current source 112 may provide the PTAT current ($I_{PTAT}$) 128 to the current-to-voltage converter circuit 114, which may convert the PTAT current ($I_{PTAT}$) 128 to a PTAT bias voltage ($V_{PTAT\_BIAS}$) 130.

The summing circuit 116 (also referred to as a bias circuit) may be configured to sum the ZTAT bias voltage ($V_{ZTAT\_BIAS}$) 122 and the PTAT bias voltage ($V_{PTAT\_BIAS}$) 130 to generate a bias voltage ($V_{SUM\_BIAS}$) 132 for the amplifier circuit 110. In an embodiment, the summing circuit 116 may be implemented as a temperature sensor-controlled buffer circuit. The summing circuit 116 may provide the bias voltage ($V_{SUM\_BIAS}$) 132 to the voltage regulator 118 of the amplifier circuit 110. The voltage regulator 118 may control (e.g., increase or decrease) the regulated voltage 136 that powers the pre-driver circuit 120 based on the value of the bias voltage ($V_{SUM\_BIAS}$) 132. It should be noted that since the bias voltage ($V_{SUM\_BIAS}$) 132 includes a PTAT voltage component (e.g., the PTAT bias voltage ($V_{PTAT\_BIAS}$) 130), the bias voltage ($V_{SUM\_BIAS}$) 132 may increase approximately linearly with temperature. In one example, as the bias voltage ($V_{SUM\_BIAS}$) 132 increases linearly with increasing temperature, the voltage regulator 118 linearly increases the regulated voltage 136. In another example, as the bias voltage ($V_{SUM\_BIAS}$) 132 decreases linearly with decreasing temperature, the voltage regulator 118 linearly decreases the regulated voltage 136.

During operation of the amplifier circuit 110, the gain of the amplifier circuit 110 may vary with temperature. For example, as the temperature of the amplifier circuit 110 increases, the gain of the amplifier circuit 110 may decrease. The bias controller 100 described herein may compensate for the decreasing gain performance of the amplifier circuit 110 when the temperature of the amplifier circuit 110 increases. For example, as the temperature of the amplifier circuit 110 increases, the bias voltage ($V_{SUM\_BIAS}$) 132 controlling the voltage regulator 118 may increase approximately linearly with temperature based on the PTAT slope of the PTAT bias voltage ($V_{PTAT\_BIAS}$) 130. The voltage regulator 118 may increase the value (e.g., the DC voltage level) of the regulated voltage 136 supplied to the pre-driver circuit 120 in response to the increase in the bias voltage ($V_{SUM\_BIAS}$) 132. The increase in the value of the regulated voltage 136 may increase the bias current of the active devices in the pre-driver circuit 120, thereby compensating for the decreased gain of the amplifier circuit 110.

In some scenarios, however, the slope of the PTAT bias voltage ($V_{PTAT\_BIAS}$) 130 may not be adequate for some operating temperatures of the amplifier circuit 110. For example, the slope of the PTAT bias voltage ($V_{PTAT\_BIAS}$) 130 may be configured to be large to compensate for the decreased gain of the amplifier circuit 110 at higher temperatures (e.g., temperatures greater than 80° C.). In this example, when the temperature of the amplifier circuit 110 is low (e.g., less than 0° C.), the slope of the PTAT bias voltage ($V_{PTAT\_BIAS}$) 130 may provide too much temperature compensation (e.g., the PTAT bias voltage ($V_{PTAT\_BIAS}$) 130 may be too large) and may cause the amplifier circuit 110 to shut down. To avoid such a scenario, and as described in detail herein, the bias controller 100 may implement a piecewise linear biasing scheme for the amplifier circuit 110 by controlling the slope of the PTAT bias voltage ($V_{PTAT\_BIAS}$) 130 as a function of temperature.

In an embodiment, the bias controller 100 may control the slope of the PTAT bias voltage ($V_{PTAT\_BIAS}$) 130 as a function of temperature by applying different PTAT slopes for the PTAT bias voltage ($V_{PTAT\_BIAS}$) 130 for different temperatures of the amplifier circuit 110. In one example embodiment, and as described in greater detail with reference to FIG. 2, the controllable current source 112 may obtain temperature data 126 corresponding to the temperature of the amplifier circuit 110 and may generate the PTAT current ($I_{PTAT}$) 128 based on a PTAT reference current and a PTAT slope that corresponds to the indicated temperature. In FIG. 1, the temperature data 126 is expressed with the notation [N−1:0] indicating that the temperature data 126 may be a digital code value (e.g., digital temperature data) including a set of N bits starting at bit 0 and ending at bit N−1. For example, N may be an integer that is greater than or equal to one. In an embodiment, the PTAT current ($I_{PTAT}$) 128 may have a first PTAT slope when the temperature is less than or equal to a temperature threshold or may have a second PTAT slope when the temperature is greater than the temperature threshold. In another embodiment, the PTAT current ($I_{PTAT}$) 128 may have the first PTAT slope when the indicated temperature is within a first range of temperatures (e.g., −40° C. to 25° C.) or may have the second PTAT slope when the indicated temperature is within a second range of temperatures (e.g., greater than 25° C. to 125° C.). In the embodiments described herein, the second PTAT slope may be greater than the first PTAT slope.

Referring to the example implementation of the controllable current source 112 in FIG. 2, the controllable current source 112 may include a PTAT reference current circuit 250 and a programmable current source 252. The PTAT reference current circuit 250 may receive the PTAT reference voltage ($V_{REF\_PTAT}$) 124 and may generate a PTAT reference current ($T_{REF\_PTAT}$) 254 based on the PTAT reference voltage ($V_{REF\_PTAT}$) 124. In an embodiment, the PTAT reference current circuit 250 may be a voltage to current converter that converts the PTAT reference voltage ($V_{REF\_PTAT}$) 124 to the PTAT reference current ($I_{REF\_PTAT}$) 254.

The programmable current source 252 may receive the PTAT reference current ($I_{REF\_PTAT}$) 254 and may obtain the temperature data 126 corresponding to the temperature of the amplifier circuit 110. The programmable current source 252 may apply a PTAT slope to the PTAT reference current ($I_{REF\_PTAT}$) 254 based on the temperature data 126. In one embodiment, the programmable current source 252 may include a digital-to-analog converter (DAC) 256 configured to receive a digital code value (e.g., temperature data 126) and to apply a PTAT slope corresponding to the digital code value. For example, a first digital code value may correspond to a first PTAT slope and a second digital code value may correspond to a second PTAT slope, where the second digital code value indicates a higher temperature of the amplifier circuit 110 than the first digital code value, and where the second PTAT slope is greater than the first PTAT slope. The first PTAT slope may be associated with a first positive coefficient value $a_1$ and the second PTAT slope may be associated with a second positive coefficient value $a_2$, where $a_1$ and $a_2$ each represent a positive number and where $a_1 < a_2$. In one example scenario, the programmable current source 252 may apply the first PTAT slope to the PTAT reference current ($I_{REF\_PTAT}$) 254 by generating a current value (e.g., PTAT current ($I_{PTAT}$) 128) that is approximately equal to the product of the PTAT reference current ($I_{REF\_PTAT}$) 254 and the first positive coefficient value $a_1$ when the first digital code value is received. In this scenario, the resulting current (e.g., PTAT current ($I_{PTAT}$) 128) may be said to have the first PTAT slope. In another example scenario, the programmable current source 252 may apply the second PTAT slope to the PTAT reference current ($I_{REF\_PTAT}$) 254 by generating a current value (e.g., PTAT current ($I_{PTAT}$) 128) that is approximately equal to the product of the PTAT reference current ($I_{REF\_PTAT}$) 254 and the second positive coefficient value $a_2$ when the second digital code value is received. In this scenario, the resulting current (e.g., PTAT current ($I_{PTAT}$) 128) may be said to have the second PTAT slope.

As previously described with reference to FIG. 1, the current-to-voltage converter circuit 114 may convert the PTAT current ($I_{PTAT}$) 128 to the PTAT bias voltage ($V_{PTAT\_BIAS}$) 130. Therefore, since the PTAT bias voltage ($V_{PTAT\_BIAS}$) 130 may have the same PTAT slope as the PTAT current ($I_{PTAT}$) 128, the PTAT bias voltage generator circuit 106 may generate the PTAT bias voltage ($V_{PTAT\_BIAS}$) 130 to have the first PTAT slope when the operating temperature of the amplifier circuit 110 is within the first range of temperatures (e.g., −40° C. to 25° C.) and to have the second PTAT slope when the operating temperature of the amplifier circuit 110 is within the second range of temperatures (e.g., greater than 25° C. to 125° C.).

Figure 3:
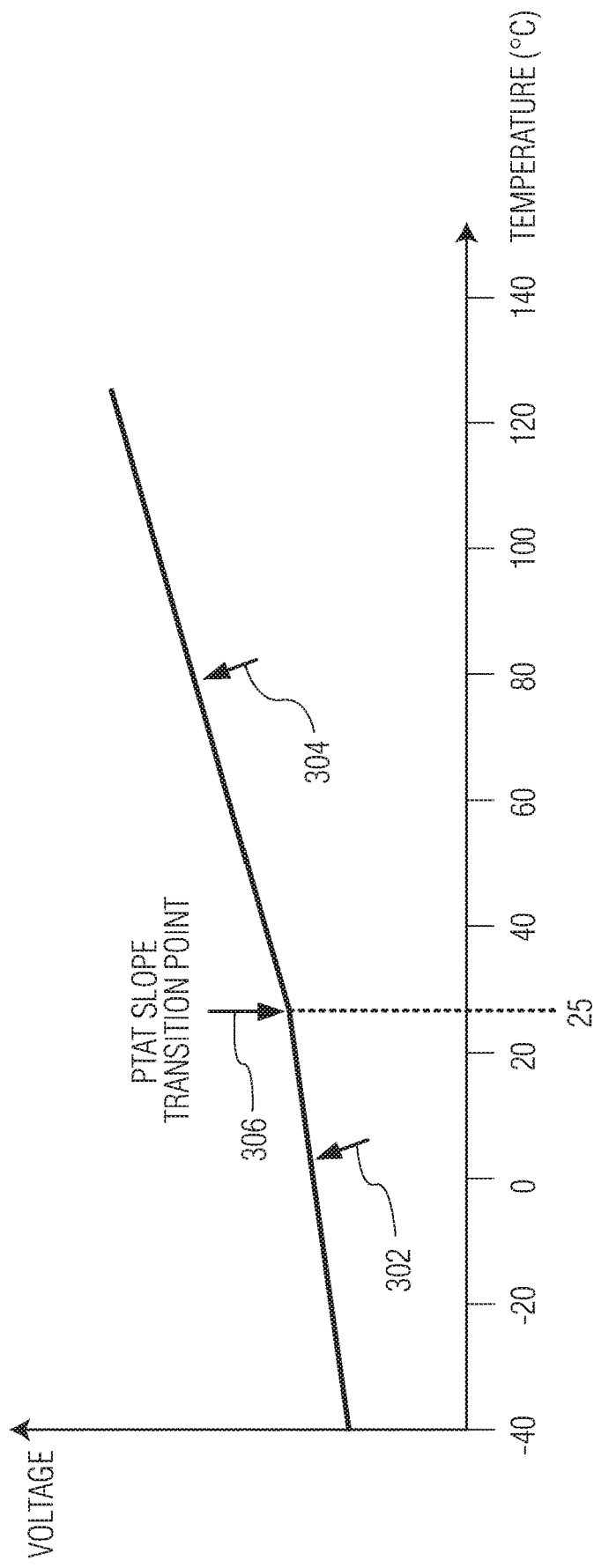
FIG. 3 depicts an example of the different proportional to absolute temperature (PTAT) slopes of a PTAT bias voltage at different temperatures of an amplifier circuit in accordance with various embodiments of the disclosure.

FIG. 3 depicts an example of the different PTAT slopes of the PTAT bias voltage ($V_{PTAT\_BIAS}$) 130 at different temperatures of the amplifier circuit 110 in accordance with various embodiments of the disclosure. As shown in FIG. 3, the PTAT bias voltage ($V_{PTAT\_BIAS}$) 130 may have the first PTAT slope 302 over a first range of temperatures (e.g., −40° C. to 25° C.) of the amplifier circuit 110 and the second PTAT slope 304 over a second range of temperatures (e.g., greater than 25° C. to 125° C.) of the amplifier circuit 110. In the example of FIG. 3, the second PTAT slope 304 is larger than the first PAT slope 302 by a factor of two (e.g., the second PTAT slope 304 is twice as large as the first PAT slope 302). In other examples, the second PTAT slope 304 may be larger than the first PAT slope 302 by a different factor (e.g., a factor less than two or a factor greater than two). Moreover, in the example of FIG. 3, the PTAT slope transition point 306 may be set to correspond to a predefined temperature (e.g., 25° C.), such that the first PTAT slope 302 of the PTAT bias voltage ($V_{PTAT\_BIAS}$) 130 changes to the second PTAT slope 304 at the predefined temperature. It should be understood that the PTAT slope transition point 306 may be set to correspond to a different temperature in other embodiments. It should also be understood that in other embodiments, more than one PTAT slope transition point may be configured for the different PTAT slopes (e.g., when three or more different PTAT slopes are implemented) of the PTAT bias voltage ($V_{PTAT\_BIAS}$) 130. In some embodiments, the temperature corresponding to the PTAT slope transition point 306 may be referred to as a temperature threshold.

Figure 4:
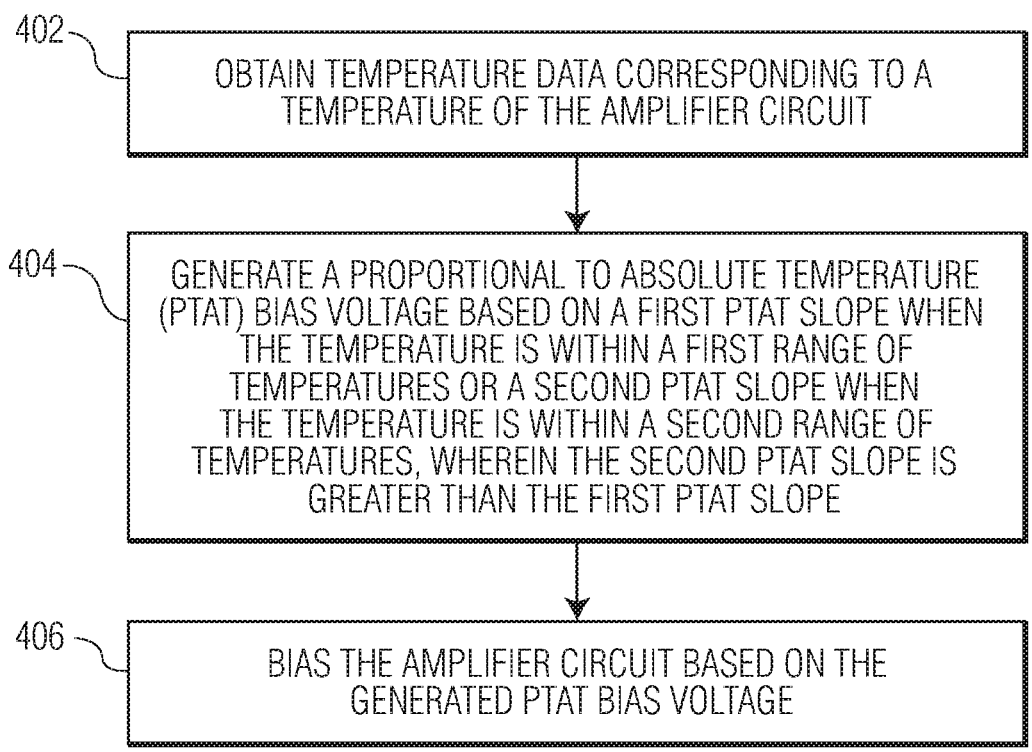
FIG. 4 is a flow diagram of a method for operating a bias controller for an amplifier circuit in accordance with various embodiments of the disclosure.

FIG. 4 is a flow diagram of a method for operating a bias controller (e.g., bias controller 100) for an amplifier circuit (e.g., amplifier circuit 100) in accordance with various embodiments of the disclosure. At block 402, the method involves obtaining temperature data corresponding to a temperature of the amplifier circuit. At block 404, the method involves generating a proportional to absolute temperature (PTAT) bias voltage based on a first PTAT slope when the temperature is within a first range of temperatures or a second PTAT slope when the temperature is within a second range of temperatures, where the second PTAT slope is greater than the first PTAT slope. At block 406, the method involves biasing the amplifier circuit based on the generated PTAT bias voltage. In an embodiment, the biasing of the amplifier circuit involves summing the PTAT bias voltage (e.g., PTAT bias voltage ($V_{PTAT\_BIAS}$) 130) and a zero to absolute temperature (ZTAT) reference voltage (e.g., ZTAT bias voltage ($V_{ZTAT\_BIAS}$) 122) to generate a bias voltage (e.g., bias voltage ($V_{SUM\_BIAS}$) 132) for the amplifier circuit. In an embodiment, generating the PTAT bias voltage involves generating a PTAT current (e.g., PTAT current ($I_{PTAT}$) 128) based on a PTAT reference voltage (e.g., PTAT reference voltage $V_{REF\_PTAT}$ 124), applying a PTAT slope (e.g., PTAT slope 302, 304) to the PTAT current based on the temperature, and converting the PTAT current to the PTAT bias voltage (e.g., PTAT bias voltage ($V_{PTAT\_BIAS}$) 130). The above-described method may be implemented by the bias controller described above with reference to FIGS. 1-3.

The bias controller (e.g., bias controller 100) described herein may improve the system gain performance of an amplifier circuit (e.g., amplifier circuit 110) over its operating temperatures. For example, the bias controller may increase the bias voltage supplied to a pre-driver circuit (e.g., pre-driver circuit 120) of the amplifier circuit based on a larger PTAT slope at higher operating temperatures (e.g., greater than 25° C. to 125° C.) and based on a smaller PTAT slope at lower operating temperatures (e.g., −40° C. to 25° C.). This piecewise linear temperature compensation approach may reduce the gain variations of the pre-driver circuit over its operating temperatures (e.g., −40° C. to 125° C.), thereby achieving a more stable system gain in the amplifier circuit. For example, the smaller PTAT slope may reduce gain variations without risking system stability or transient issues at cold temperatures (e.g., −40° C. to 25° C.). Therefore, the bias controller described herein may reduce the gain variations of the pre-driver circuit without the need to increase the size of the pre-driver circuit for nominal operating conditions. Moreover, the bias controller (e.g., bias controller 100) described herein may be integrated into an amplifier design with low cost and without consuming a significant area on an integrated circuit (IC).

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for operating a bias controller for an amplifier circuit, the method comprising:
    obtaining temperature data corresponding to a temperature of the amplifier circuit;
    generating a proportional to absolute temperature (PTAT) bias voltage based on a first PTAT slope when the temperature is within a first range of temperatures or a second PTAT slope when the temperature is within a second range of temperatures, wherein the second PTAT slope is greater than the first PTAT slope, and wherein PTAT slope is a linear relationship between a voltage and a temperature; and
    biasing the amplifier circuit based on the generated PTAT bias voltage, wherein biasing the amplifier circuit comprises:
    summing the PTAT bias voltage and a zero to absolute temperature (ZTAT) reference voltage to generate a bias voltage for the amplifier circuit.

2. The method of claim 1, wherein generating the PTAT bias voltage comprises:
    generating a PTAT current based on a PTAT reference voltage;
    applying a PTAT slope to the PTAT current based on the temperature; and
    converting the PTAT current to the PTAT bias voltage.

3. The method of claim 1, wherein a PTAT slope transition point between the first PTAT slope and the second PTAT slope is set to a predefined temperature.

4. The method of claim 1, wherein the first range of temperatures includes temperature values that are lower than the second range of temperatures.

5. The method of claim 1, wherein the temperature data comprises digital temperature data from a temperature sensor circuit.

6. The method of claim 1, wherein the second PTAT slope enables the amplifier circuit to maintain a higher gain at temperatures above 25° C. relative to the first PTAT slope.

7. A bias controller for an amplifier circuit, the bias controller comprising:
    a proportional to absolute temperature (PTAT) bias voltage generator circuit configured to
        obtain temperature data corresponding to a temperature of the amplifier circuit, and
        generate a PTAT bias voltage based on a first PTAT slope when the temperature is within a first range of temperatures or a second PTAT slope when the temperature is within a second range of temperatures, wherein the second PTAT slope is greater than the first PTAT slope, and wherein PTAT slope is a linear relationship between a voltage and a temperature; and
    a biasing circuit configured to bias the amplifier circuit based on the generated PTAT bias voltage;
    wherein the temperature data comprises digital temperature data from a temperature sensor circuit.

8. The bias controller of claim 7, wherein the biasing circuit comprises:
    a summing circuit that sums the PTAT bias voltage and a zero to absolute temperature (ZTAT) bias voltage to generate a bias voltage for the amplifier circuit.

9. The bias controller of claim 7, wherein the PTAT bias voltage generator circuit is further configured to:
    generate a PTAT current based on a PTAT reference voltage;
    apply a PTAT slope to the PTAT current based on the temperature data; and
    convert the PTAT current to the PTAT bias voltage.

10. The bias controller of claim 7, wherein a PTAT slope transition point between the first PTAT slope and the second PTAT slope is set to a predefined temperature.

11. The bias controller of claim 7, wherein the first range of temperatures includes temperature values that are lower than the second range of temperatures.

12. The bias controller of claim 7, wherein the second PTAT slope enables the amplifier circuit to maintain a higher gain at temperatures above 25° C. relative to the first PTAT slope.

13. A proportional to absolute temperature (PTAT) bias voltage generator circuit for biasing an amplifier circuit, the PTAT bias voltage generator circuit comprising:
    a controllable current source that includes
        a PTAT reference current circuit configured to generate a PTAT reference current, a programmable current source configured to obtain temperature data and to
generate a PTAT current based on the PTAT reference current and the temperature data, the temperature data corresponding to a temperature of the amplifier circuit, wherein the PTAT current has a first PTAT slope when the temperature is less than or equal to a temperature threshold or has a second PTAT slope when the temperature is greater than the temperature threshold, wherein the second PTAT slope is greater than the first PTAT slope, and wherein PTAT slope is a linear relationship between a voltage and a temperature; and
a current to voltage converter circuit configured to convert the PTAT current to a PTAT bias voltage for the amplifier circuit.

14. The PTAT bias voltage generator circuit of claim 13, wherein the controllable current source generates the PTAT reference current based on a PTAT reference voltage.

15. The PTAT bias voltage generator circuit of claim 13, wherein a PTAT slope transition point between the first PTAT slope and the second PTAT slope is set to the threshold temperature.

16. The PTAT bias voltage generator circuit of claim 13, wherein the programmable current source includes a digital-to-analog converter (DAC) that applies the first PTAT slope or the second PTAT slope to the PTAT reference current based on the temperature data.

17. The PTAT bias voltage generator circuit of claim 13, wherein the temperature data comprises digital temperature data from a temperature sensor circuit.

18. The PTAT bias voltage generator circuit of claim 13, wherein the second PTAT slope enables the amplifier circuit to maintain a higher gain at temperatures above 25° C. relative to the first PTAT slope.

* * * * *